United States Patent
Kotera

(10) Patent No.: US 11,318,641 B2
(45) Date of Patent: May 3, 2022

(54) LAMINATED FILM AND METHOD FOR PRODUCING SEMICONDUCTOR ELEMENT

(71) Applicant: AGC Inc., Chiyoda-ku (JP)

(72) Inventor: Seigo Kotera, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 51 days.

(21) Appl. No.: 16/822,110

(22) Filed: Mar. 18, 2020

(65) Prior Publication Data
US 2020/0215728 A1 Jul. 9, 2020

Related U.S. Application Data

(63) Continuation of application No. PCT/JP2018/042015, filed on Nov. 13, 2018.

(30) Foreign Application Priority Data

Nov. 17, 2017 (JP) .............................. JP2017-222227

(51) Int. Cl.
*B29C 33/68* (2006.01)
*B29C 45/14* (2006.01)
(Continued)

(52) U.S. Cl.
CPC ........ *B29C 33/68* (2013.01); *B29C 45/14819* (2013.01); *B32B 27/08* (2013.01);
(Continued)

(58) Field of Classification Search
CPC .............. B32B 27/08; B32B 2307/736; B32B 2307/518; B32B 2307/51; B32B 27/34;
(Continued)

(56) References Cited

U.S. PATENT DOCUMENTS

2016/0200007 A1 7/2016 Kasamatsu et al.
2016/0368175 A1 12/2016 Kasai et al.
2016/0368177 A1 12/2016 Kasai et al.

FOREIGN PATENT DOCUMENTS

JP 2006-049850 A 2/2006
JP 2010-208104 A 9/2010
(Continued)

OTHER PUBLICATIONS

International Search Report dated Jan. 15, 2019 in PCT/JP2018/042015 filed on Nov. 13, 2018, citing documents AA-AC & AO-AQ therein, 2 pages.

*Primary Examiner* — James C Yager
(74) *Attorney, Agent, or Firm* — Oblon, McClelland, Maier & Neustadt, L.L.P.

(57) ABSTRACT

To provide a film capable of suppressing both of formation of wrinkles when a release film is suction-attached to a cavity surface in compression molding, and formation of wrinkles when the cavity bottom surface to which the release film has been suction-attached is raised; and a method for producing a semiconductor element by using said film. A laminated film 1 comprises a layer 3 of shrinkable film, of which the storage elastic modulus E' at 180° C. is at least 70 MPa, and the thermal shrinkage in 30 minutes at 180° C., with reference to 20° C., in each of the machine direction (MD) and the transverse direction (TD), is at least 3%, and a fluororesin layer 5 present on one side or both sides of the shrinkable film layer 3.

18 Claims, 2 Drawing Sheets

(51) Int. Cl.
*B32B 27/08* (2006.01)
*B32B 27/32* (2006.01)
*B32B 27/34* (2006.01)
*H01L 21/56* (2006.01)
*B29L 31/34* (2006.01)

(52) U.S. Cl.
CPC ............ *B32B 27/322* (2013.01); *B32B 27/34* (2013.01); *H01L 21/566* (2013.01); *B29L 2031/34* (2013.01); *B32B 2307/51* (2013.01); *B32B 2307/518* (2013.01); *B32B 2307/736* (2013.01)

(58) Field of Classification Search
CPC . B32B 27/322; B32B 2250/24; B32B 27/304; B32B 2307/734; B32B 27/302; B32B 2255/10; B32B 2307/748; B32B 7/12; B32B 27/16; B32B 27/18; B32B 27/286; B32B 27/36; B32B 2307/54; B32B 2457/14; B32B 27/32; B32B 37/144; B29C 33/68; B29C 45/14819; B29C 37/0075; B29C 43/18; B29L 2031/34; H01L 21/566; H01L 23/3121; H01L 2224/48091; H01L 2224/97; H01L 2924/181; H01L 21/56
See application file for complete search history.

(56) References Cited

FOREIGN PATENT DOCUMENTS

| | | |
|---|---|---|
| WO | WO 2015/037426 A1 | 3/2015 |
| WO | WO 2015/133630 A1 | 9/2015 |
| WO | WO 2015/133634 A1 | 9/2015 |
| WO | WO 2017/094871 A1 | 6/2017 |

LAMINATED FILM AND METHOD FOR PRODUCING SEMICONDUCTOR ELEMENT

TECHNICAL FIELD

The present invention relates to a laminated film and a method for producing a semiconductor element.

BACKGROUND ART

A semiconductor chip is usually accommodated (encapsulated) in a container called a package for blocking and protection from the outside air, to be a semiconductor element. As the package, a molded product made of a cured product of a curable resin (e.g. a thermosetting resin such as an epoxy resin) is used. As a method for producing a semiconductor element, for example, so-called a transfer molding method or a compression molding method is known, wherein a semiconductor chip or the like is placed so as to be positioned at a predetermined location in a mold, and a curable resin is filled and cured in the mold.

In a process for producing a semiconductor element, there is a case of placing a release film on the cavity surface of a mold. The release film is, after being inserted into the mold, stretched along the cavity surface by vacuum suction, and brought in such a state of being in close contact with the cavity surface. At that time, there may be a case where the release film is brought in close contact with the cavity surface in such a state that air is not completely withdrawn between the release film and the cavity surface, whereby wrinkles may be formed in the release film. If there are wrinkles in the release film, the shape of the wrinkles in the release film will be transferred to the surface of the package, thus leading to poor appearance, and the yield will be lowered.

With respect to such problems, the following release films are proposed.

A release film for sealing a semiconductor chip, having a fluororesin film laminated on at least one side of a stretched polyester resin film (Patent Document 1).

A release film for semiconductor sealing process, comprising a surface layer which contains a 4-methyl-1-pentene copolymer, and of which the storage elastic modulus E' at 175° C. is from 45 to 105 MPa, and a heat-resistant resin layer, of which the storage elastic modulus E' at 175° C. is from 100 to 250 MPa (Patent Document 2).

A release film having a first layer with a thickness of from 5 to 30 μm, made of at least one type selected from the group consisting of a fluororesin and a polyolefin with a melting point of at least 200° C., and a second layer with a thickness of from 38 to 100 μm, of which the product of the thickness and the tensile storage modulus at 180° C. is at most 18,000 MPa·μm and the product of the thickness and the tensile breaking stress at 180° C. is at least 2,000 MPa·μm (Patent Document 3).

A release film for processing, which comprises a release layer, of which the contact angle to water is from 90 to 130°, and a heat-resistant resin layer, and of which the thermal dimensional change from 23° C. to 120° C. in TD (transverse direction) is at most 3% (Patent Document 4).

PRIOR ART DOCUMENTS

Patent Documents

Patent Document 1: JP-A-2006-49850
Patent Document 2: JP-A-2010-208104
Patent Document 3: WO2015/133634
Patent Document 4: WO2017/094871

DISCLOSURE OF INVENTION

Technical Problems

Generally in a compression molding process, a release film is brought in close contact with the surface (cavity surface) of a recess provided in the lower mold, then a curable resin is placed thereon, and the lower mold and the upper mold are clamped, whereupon the bottom surface (cavity bottom surface) of the recess is raised to adjust the depth of the recess to the thickness of the molded product (package, etc.). The depth of the recess in the lower mold at the time when the release film is brought in close contact, is, for example, about several times the thickness of the molded product to be formed.

When the bottom surface of the recess is raised, correspondingly, the stretched release film shrinks. However, at that time, there may be a case where the release film does not sufficiently shrink, whereby the film tends to have excess portions leading to wrinkles. According to the studies by the present inventors, such excess portions of the film are likely to be formed in a case where the thickness of the molded product to be formed is thin (e.g. from 0.1 to 0.7 mm), i.e. in a case where the amount to be stretched of the release film is small. The release films in Patent Documents 1 to 4 are insufficient in effects for inhibiting such wrinkles.

An object of the present invention is to provide a laminated film which is capable of suppressing both of formation of wrinkles at the time of bringing the release film in close contact with the cavity surface, and formation of wrinkles at the time of raising the cavity bottom surface with which the release film is in close contact, and a method for producing a semiconductor element using such a laminated film.

Solution to Problems

The present invention provides a laminated film and a method for producing a semiconductor element, having constructions of the following [1] to [15].
[1] A laminated film characterized by comprising a layer of shrinkable film, of which the storage elastic modulus E' at 180° C. is at least 70 MPa, and the thermal shrinkage in 30 minutes at 180° C., with reference to 20° C., in each of the machine direction (MD) and the transverse direction (TD), is at least 3%, and a fluororesin layer present on one side or both sides of the layer of shrinkable film, wherein at least one side is a surface of the fluororesin layer.
[2] The laminated film according to [1], wherein the storage elastic modulus E' at 180° C. of the laminated film is at least 70 MPa, and the thermal shrinkage in 30 minutes at 180° C., with reference to 20° C. in each of MD and TD of the laminated film is at least 2%.
[3] The laminated film according to [1] or [2], wherein the fluororesin layer is present on both sides of the layer of shrinkable film.

[4] The laminated film according to any one of [1] to [3], wherein an adhesive layer is further present between the layer of shrinkable film and the fluororesin layer.
[5] The laminated film according to any one of [1] to [4], wherein the shrinkable film is a biaxially stretched film.
[6] The laminated film according to any one of [1] to [5], wherein the shrinkable film is a shrinkable film composed of at least one type of resin selected from the group consisting of a polyamide resin, a polyester resin, a polystyrene resin, and a biological resin.
[7] The laminated film according to any one of [1] to [6], wherein the shrinkable film is a biaxially stretched polyamide resin film.
[8] The laminated film according to any one of [1] to [7], wherein the fluororesin is a fluororesin made of a fluoroolefin type polymer.
[9] The laminated film according to [8], wherein the fluoroolefin type polymer is an ethylene-tetrafluoroethylene type copolymer.
[10] The laminated film according to any one of [1] to [9], wherein the fluororesin layer is a layer of a fluororesin film.
[11] The laminated film according to any one of [1] to [10], which is used as a release film.
[12] The laminated film according to [11], wherein the release film is a release film which is to be disposed in a recess of a mold so as to be in contact with a sealing resin, in a step of resin sealing in the production of a semiconductor element.
[13] A method for producing a semiconductor element comprising a substrate, a semiconductor chip, a connecting terminal and a resin sealing portion made of a cured product of a curable resin, by using a compression molding apparatus comprising an upper mold and a lower mold, characterized by
disposing a structure having the substrate, the semiconductor chip and the connecting terminal on one of the upper mold and the lower mold,
disposing the laminate film as defined in any one of [1] to [12], as a release film, so as to cover a recess provided in the other of the upper mold and the lower mold, and so that the surface of the fluororesin layer faces the molding space of the mold, and bringing it in close contact with the surface of the recess,
disposing a curable resin between the upper mold and the lower mold, and clamping the upper mold and the lower mold and moving the bottom surface of the recess thereby to compress the curable resin and at the same time to thermoset the curable resin to form a resin sealing portion.
[14] The method for producing a semiconductor element according to [13], wherein the thickness of the resin sealing portion is from 0.1 to 0.7 mm.
[15] The method for producing a semiconductor element according to [13] or [14], wherein the depth of the recess at the time of bringing the said laminated film in close contact with the surface of the recess is deeper than the thickness of the resin sealing portion, and is from 0.125 to 1.1 mm.

Advantageous Effects of Invention

According to the laminated film of the present invention, it is possible to suppress both of formation of wrinkles at the time of bringing the release film in close contact with the cavity surface in the compression molding, and formation of wrinkles at the time of raising the cavity bottom surface with which the release film is brought in close contact.

According to the method for producing a semiconductor element of the present invention, it is possible to suppress both of formation of wrinkles at the time of bringing the release film in close contact with the cavity surface in the compression molding, and formation of wrinkles at the time of raising the cavity bottom surface with which the release film is brought in close contact, and it is possible to obtain a semiconductor element excellent in appearance.

DESCRIPTION OF EMBODIMENTS

Figure 1:
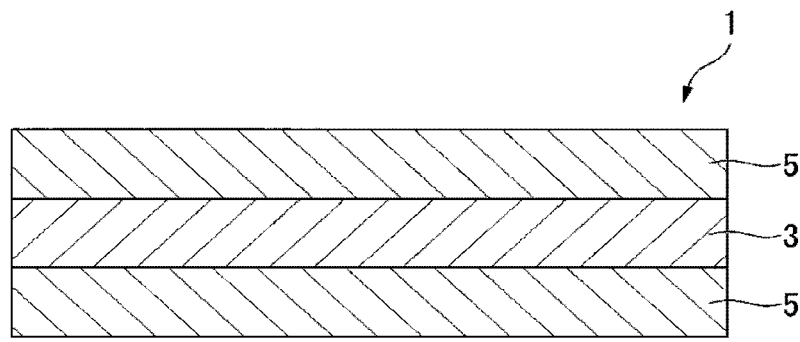
FIG. 1 is a schematic cross-sectional view showing an example of the laminated film of the present invention.

In this specification, meanings of the following terms are as follows.

The "thickness" of a film is measured by a contact type thickness meter OG-525H (manufactured by Ono Sokki Co., Ltd.) using a feeler AA-026 ($\varphi$10 mm SR7).

The "storage elastic modulus E'" (tensile storage elastic modulus) is measured by using a dynamic viscoelasticity measuring apparatus. By setting the sample measuring size to be a width 5 mm, the length between chucks to be 20 mm, and the frequency to be 10 Hz, and by raising the temperature at a rate of 2° C./min from 20° C., E' measured at a value of 180° C., is taken as the storage elastic modulus at 180° C. (hereinafter referred to also as "storage elastic modulus (180° C.)").

The storage elastic modulus E' (180° C.) of a film is the average value of the storage elastic modulus E' (180° C.) in MD of the film, and the storage elastic modulus E' (180° C.) in TD of the film.

The "thermal shrinkage" is $-(\Delta L)$. $\Delta L$ is a dimensional change rate (%) obtained by the following method.

At a reference temperature, in a laminated film of 12 cm×12 cm, one straight line with a length of 10 cm is drawn in each direction of MD (Machine Direction) and TD (Transverse Direction), and the distance between end points of each straight line is taken as an initial length $L_0$. Then, the laminated film is heat-treated under predetermined conditions and cooled to the reference temperature, whereupon the linear distance $L_1$ between end points of each straight line drawn on the laminated film, is measured, whereby the dimensional change rate $\Delta L$ (%) is obtained by the following formula 1.

$$\text{Dimensional change rate } \Delta L(\%) = (L_1/L_0 - 1) \times 100 \qquad \text{Formula 1}$$

The thermal shrinkage in MD is obtained from $\Delta L$ obtained with respect to the straight line along MD, and the thermal shrinkage in TD is obtained from ΔL obtained with respect to the straight line along TD.

The thermal shrinkage obtained by setting the reference temperature to be 20° C. and the heat treatment conditions to be 180° C. for 30 minutes, is taken as the "thermal shrinkage in 30 minutes at 180° C., with reference to 20° C." (hereinafter referred to also as the "thermal shrinkage (180° C.)").

The "melting point" means the temperature corresponding to the maximum value of the melting peak as measured by a differential scanning calorimetry (DSC) method.

"Units" in a resin made of a polymer represent structural units (monomer units) constituting the polymer.

A "(meth)acrylate" is a general term for an acrylate and a methacrylate.

The dimensional ratios in FIGS. 1 to 6 are, for convenience of explanation, ones different from the actual ones.

[Laminated Film]

The laminated film of the present invention (hereinafter referred to also as "the present laminated film") is characterized by comprising a layer of shrinkable film and a fluororesin layer present on one side or both sides of the layer of shrinkable film, wherein at least one side is a surface of the fluororesin layer.

Accordingly, the present laminated film has a construction in which from the first surface side of the present laminated film, a fluororesin layer and a layer of shrinkable film are present in this order, or a construction in which a fluororesin layer, a layer of shrinkable film and a fluororesin layer are present in this order.

Hereinafter, the fluororesin layer located on the first surface side than the layer of shrinkable film will be referred to also as the "first fluororesin layer". Further, the fluororesin layer located on the second surface side opposite to the first surface, than the layer of shrinkable film, will be referred to also as the "second fluororesin layer".

In the present laminated film, at least one side is a surface of the fluororesin layer, and, hereinafter, the essential fluororesin layer surface will be regarded as the first surface. That is, the present laminated film has a first fluororesin layer as the outermost layer on the first surface side.

The present laminated film may have, or may not have, a second fluororesin layer. In the case of having a second fluororesin layer, the second fluororesin layer may be present as the outermost layer on the second surface side of the present laminated film, or may be present as an internal layer at the second surface side. In a case where the second fluororesin layer is an internal layer, there will be another layer on the second surface side. In a case where a second fluororesin layer does not exist, the second surface side of the present laminated film may be a surface of the shrinkable film layer, or on the second surface side, another layer may be present as described later.

The present laminated film may further contain, as the case requires, another layer between the layer of shrinkable film and the fluororesin layer (the first fluororesin layer or the second fluororesin layer). Another layer may be an adhesive layer, an antistatic layer, a conductive layer, a gas-absorbing layer, a colored layer, etc. The present laminated film particularly preferably has an adhesive layer.

In a case where the present laminated film has a first fluororesin layer and a second fluororesin layer, on the second surface side of the second fluororesin layer, another layer such as the above antistatic layer may be present.

FIG. 1 is a schematic cross-sectional view showing an example of the present laminated film. The laminated film 1 in this example consists of a layer 3 of shrinkable film, and fluororesin layers 5 (the first fluororesin layer and the second fluororesin layer) present on both sides of the layer 3 of shrinkable film.

Figure 2:
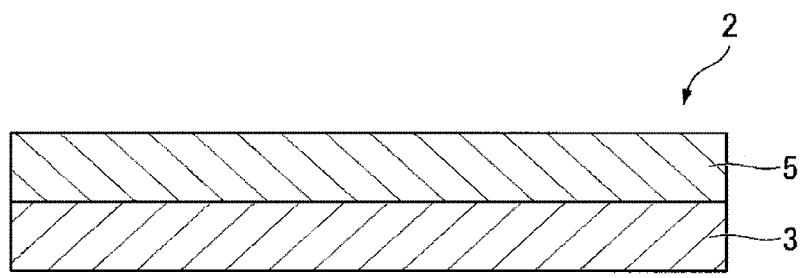
FIG. 2 is a schematic cross-sectional view showing another example of the laminated film of the present invention.

FIG. 2 is a schematic cross-sectional view showing another example of the present laminated film. The laminated film 2 in this example consists of a layer 3 of shrinkable film, and a fluororesin layer 5 (the first fluororesin layer) present on one side of the layer 3 of shrinkable film.

In the laminated film 1 and the laminated film 2, it is preferred that an adhesive layer (not shown) is present between the layer 3 of shrinkable film and the fluororesin layer 5.

(Shrinkable Film)

The layer of shrinkable film in the present laminated film, is a layer formed from a shrinkable film, of which the above storage elastic modulus is at least 70 MPa, and each of the above thermal shrinkage in MD and the above thermal shrinkage in TD is at least 3%.

The shrinkable film is a resin film having a characteristic (hereinafter referred to also as a "shrinkage characteristic") such that when heated above room temperature, its size undergoes shrinkage.

The shrinkage characteristic of the shrinkable film is due to a residual stress, i.e. by heating, the residual stress will be relaxed, whereby the film will shrink. As the shrinkable film, for example, a film having a residual strain imparted during film molding, or a film having a stress given by e.g. biaxial stretching treatment or blow molding, is used without being subjected to residual stress relaxation treatment such as heat setting.

As the resin constituting the shrinkable film, polyvinyl chloride (PVC), a polyester resin (polyethylene terephthalate (PET), polyethylene naphthalate (PEN), etc.), a polyolefin resin (polyethylene, polypropylene, etc.), a polyamide resin (PA6, PA66, PA11, PA12, PAMDX6, etc.), polyphenylene sulfide (PPS), a biological resin (a resin composed mainly of polylactic acid, cellulose, chitin, chitosan, kenaf, etc.), etc. may be mentioned. The resin constituting the shrinkable film may be one type, or two or more types.

Among these, from the viewpoint of excellent mechanical strength and film moldability, at least one type selected from the group consisting of a polyamide resin, a polyester resin, a polystyrene resin, and a biological resin, is preferred, and from such a viewpoint that it will be easy to impart shrinkability, a polyamide resin is particularly preferred.

The melting point of the resin is preferably at least 200° C., particularly preferably from 220 to 300° C. When the melting point of the resin is at least 200° C., a phase change such as melting at a standard curing temperature (from 170 to 180° C.) of Epoxy Molding Compound (EMC) being commonly used as a curable resin in the production of semiconductor elements, is less likely to occur.

The shrinkable film may further contain an additive, as the case requires. As the additive, a coloring component, an antioxidant, a thermal deterioration preventing agent, a stabilizer or the like may be mentioned.

As the shrinkable film, a biaxially stretched film is preferred, in that it is easy to control the residual strain of the film.

Here, a common biaxially stretched film is a film having a high dimensional stability, which is obtained in such a manner that a film is molded and subjected to biaxial stretching treatment, followed by heat treatment operation to relax a residual stress. However, such a film having a high dimensional stability is not suitable for the present invention.

As the shrinkable film being a biaxially stretched film, a biaxially stretched polyamide resin film (e.g. manufactured by Unitika Ltd., Emblem (registered trademark) MS and Emblem NK), a biaxially stretched polystyrene resin film (e.g. manufactured by Mitsubishi Chemical Corporation, DXL (registered trademark) film), a biaxially stretched polyester resin film (e.g. manufactured by Mitsubishi Chemical Corporation, HISHIPET (registered trademark)), a biaxially stretched biological resin film (e.g. manufactured by Mitsubishi Chemical Corporation, PLABIO (registered trademark)), a multi-layered hybrid stretched film (e.g. manufactured by Mitsubishi Chemical Corporation, HybrexDL (registered trademark)), etc. may be exemplified.

Among them, a biaxially stretched film made of a resin having a melting point of at least 200° C. is preferred, and a biaxially stretched polyamide resin film is particularly preferred.

The thermal shrinkage (180° C.) in MD of the shrinkable film is at least 3%, preferably from 3 to 30%, particularly preferably from 3 to 25%.

The thermal shrinkage (180° C.) in TD of the shrinkable film is at least 3%, preferably from 3 to 30%, particularly preferably from 3 to 25%.

When each thermal shrinkage (180° C.) in MD and TD of the shrinkable film is at least the above lower limit, it is possible to suppress formation of wrinkles at the time of raising the cavity bottom surface with which the laminated film is brought in close contact. When each thermal shrinkage (180° C.) in MD and TD is at most the above upper limit value, the film form after thermal shrinkage will be retained, and the film flatness will be good.

The storage elastic modulus (180° C.) of the shrinkable film is at least 70 MPa, preferably from 100 to 500 MPa, particularly preferably from 200 to 350 MPa. When the storage elastic modulus (180° C.) of the shrinkable film is at least the above lower limit value, it is possible to suppress formation of wrinkles at the time of bringing the laminated film in close contact with the cavity surface. When the storage elastic modulus (180° C.) is at most the above upper limit value, followability to the mold will be good.

The storage elastic modulus (180° C.) can be adjusted by the material constituting the shrinkable film.

The thickness of the shrinkable film is preferably from 10 to 100 μm, more preferably from 10 to 50 μm, particularly preferably from 10 to 40 μm. When the thickness of the shrinkable film is at least the above lower limit value, the mechanical properties will be excellent. When the thickness of the shrinkable film is at most the above upper limit value, the flexibility will be excellent, so that the followability to the shape of the mold will be more excellent.

(Fluororesin Layer)

The fluororesin constituting the fluororesin layer is preferably a fluororesin made of a fluoroolefin type polymer, from the viewpoint of the releasability and heat resistance. The fluoroolefin type polymer is a polymer having units based on a fluoroolefin.

The fluoroolefin may be tetrafluoroethylene (hereinafter referred to also as "TFE"), vinyl fluoride, vinylidene fluoride, trifluoroethylene, hexafluoropropylene, chlorotrifluoroethylene, etc. One type of these fluoroolefins may be used alone, or two or more types of them may be used in combination.

The fluoroolefin type polymer may further contain units based on a monomer other than fluoroolefins. The monomer other than fluoroolefins may be ethylene, or a third monomer which will be described later.

As the fluoroolefin type polymer, an ethylene-TFE type copolymer (hereinafter referred to also as "ETFE"), polytetrafluoroethylene, or a perfluoro(alkyl vinyl ether)-TFE type copolymer is preferred. One type of these fluoroolefin polymers may be used alone, or two or more types of them may be used in combination.

Here, "type" in the ETFE and perfluoro(alkyl vinyl ether)-TFE type copolymer, indicates that it may further have units based on another monomer.

Among the fluoroolefin type polymers, from such a viewpoint that elongation at a high temperature is large, ETFE is preferred. ETFE is a copolymer having units based on ethylene (hereinafter referred to also as "E units") and units based on TFE (hereinafter referred to also as "TFE units").

ETFE is preferably a copolymer having E units, TFE units and units based on a monomer other than ethylene and TFE (hereinafter referred to also as a "third monomer"). By the type or content of units based on the third monomer, it will be easy to adjust the crystallinity of ETFE, and accordingly, the storage elastic modulus E' of the fluororesin layer. Further, by having the third monomer, in particular units based on a monomer having fluorine atoms, it will be possible to improve the tensile strength and elongation at a high temperature (e.g. at about 180° C.).

As the third monomer, a monomer having fluorine atoms, and a monomer having no fluorine atom, may be mentioned.

As the monomer having fluorine atoms, the following monomers (a1) to (a5), etc. may be mentioned.

Monomer (a1): a fluoroolefin having 3 or less carbon atoms (but, excluding TFE).

Monomer (a2): a polyfluoroalkylethylene represented by $X^1(CF_2)_nCX^2=CH_2$ (wherein $X^1$ and $X^2$ are each independently a hydrogen atom or a fluorine atom, and n is an integer of from 2 to 8).

Monomer (a3): a fluorovinyl ether.

Monomer (a4): a functional group-containing fluorovinyl ether.

Monomer (a5): a fluorinated monomer having an aliphatic ring structure.

As the monomer (a1), a fluoroethylene (trifluoroethylene, vinylidene fluoride, vinyl fluoride, chlorotrifluoroethylene, etc.), a fluoropropylene (hexafluoropropylene (hereinafter referred to also as "HFP"), 2-hydropentafluoropropylene, etc.), etc., may be mentioned.

As the monomer (a2), a monomer wherein n is an integer of from 2 to 6 is preferred, and a monomer wherein n is an integer of from 2 to 4 is particularly preferred. Further, a monomer wherein $X^1$ is a fluorine atom, and $X^2$ is a hydrogen atom, i.e. a (perfluoroalkyl)ethylene is particularly preferred.

As the monomer (a2), $CF_3CF_2CH=CH_2$, $CF_3CF_2CF_2CF_2CH=CH_2$ ((perfluorobutyl) ethylene, hereinafter referred to also as "PFBE"), $CF_3CF_2CF_2CF_2CF=CH_2$, $CF_2HCF_2CF_2CF=CH_2$, $CF_2HCF_2CF_2CF_2CF=CH_2$, etc. may be mentioned.

As the monomer (a3), $CF_2=CFOCF_3$, $CF_2=CFOCF_2CF_3$, $CF_2=CFO(CF_2)_2CF_3$ (perfluoro(propyl vinyl ether), hereinafter referred to also as "PPVE"), $CF_2=CFOCF_2CF(CF_3)O(CF_2)_2CF_3$, $CF_2=CFO(CF_2)_3O(CF_2)_2CF_3$, $CF_2=CFO(CF_2CF(CF_3)O)_2(CF_2)_2CF_3$, $CF_2=CFOCF_2CF(CF_3)O(CF_2)_2CF_3$, $CF_2=CFOCF_2CF=CF_2$, $CF_2=CFO(CF_2)_2CF=CF_2$, etc. may be mentioned. Among these, a monomer which is a diene is a cyclopolymerizable monomer.

As the monomer (a4), $CF_2$=$CFO(CF_2)_3CO_2CH_3$, $CF_2$=$CFOCF_2CF(CF_3)O(CF_2)_3CO_2CH_3$, $CF_2$=$CFOCF_2CF(CF_3)O(CF_2)_2SO_2F$, etc. may be mentioned.

As the monomer (a5), perfluoro(2,2-dimethyl-1,3-dioxole), 2,2,4-trifluoro-5-trifluoromethoxy-1,3-dioxole, perfluoro(2-methylene-4-methyl-1,3-dioxolane), etc. may be mentioned.

As the monomer having no fluorine atom, the following monomers (b1) to (b4), etc. may be mentioned.

Monomer (b1): an olefin (but excluding ethylene).
Monomer (b2): a vinyl ester.
Monomer (b3): a vinyl ether.
Monomer (b4): an unsaturated acid anhydride.

Specific examples of the monomer (b1) may be propylene, isobutene, etc.

Specific examples of the monomer (b2), may be vinyl acetate, etc.

Specific examples of the monomer (b3) may be ethyl vinyl ether, butyl vinyl ether, cyclohexyl vinyl ether, hydroxybutyl vinyl ether, etc.

Specific examples of the monomer (b4) may be maleic anhydride, itaconic anhydride, citraconic anhydride, himic anhydride (5-norbornene-2,3-dicarboxylic acid anhydride), etc.

As the third monomer, one type may be used alone, or two or more types may be used in combination.

As the third monomer, from such a viewpoint that it will be easy to adjust crystallinity i.e. to adjust the storage elastic modulus E' and from such a viewpoint that the tensile strength and elongation at a high temperature (e.g. about 180° C.) will be excellent by having units based on a third monomer, particularly a monomer having fluorine atoms, the monomer (a2), HFP, PPVE, or vinyl acetate is preferred; HFP, PPVE, $CF_3CF_2CH$=$CH_2$, or PFBE is more preferred; and PFBE is particularly preferred. That is, as ETFE, a copolymer having E units, TFE units and units based on PFBE, is particularly preferred.

In ETFE, the molar ratio of TFE units to E units (TFE units/E units) is preferably from 40/60 to 80/20, more preferably from 45/55 to 70/30, particularly preferably from 50/50 to 65/35. When the TFE units/E units is within the above range, ETFE will be more excellent in heat resistance and mechanical properties.

The proportion of units based on the third monomer in ETFE, is preferably from 0.01 to 20 mol %, more preferably from 0.10 to 15 mol %, particularly preferably from 0.20 to 10 mol %, to the total amount (100 mol %) of all units constituting ETFE. When the proportion of units based on the third monomer, is within the above range, ETFE will be more excellent in heat resistance and mechanical properties.

In a case where units based on the third monomer include units based on PFBE, the proportion of units based on PFBE is preferably from 0.5 to 4.0 mol %, more preferably from 0.7 to 3.6 mol %, particularly preferably from 1.0 to 3.6 mol %, to the total amount (100 mol %) of all units constituting ETFE. When the proportion of units based on PFBE is within the above range, the heat resistance of the fluororesin layer will be more excellent. Further, the tensile strength and elongation at a high temperature (e.g. about 180° C.) will be more excellent.

The melt flow rate (MFR) of ETFE is preferably from 2 to 40 g/10 min, more preferably from 5 to 30 g/10 min, particularly preferably from 10 to 20 g/10 min. When MFR is within the above range, moldability of ETFE will be improved, and mechanical properties of the fluororesin layer will be excellent.

MFR of ETFE is a value measured under a load of 49N at 297° C. in accordance with ASTM D3159.

The fluororesin of the fluororesin layer may contain additives, as the case requires. The additives may be a colorant, an ultraviolet absorber, an inorganic filler, a heat aging preventing agent, an antioxidant, an organic filler such as a resin other than a fluororesin, etc.

The thickness of the fluororesin layer is preferably from 5 to 50 µm, more preferably from 5 to 30 µm, particularly preferably from 5 to 20 µm. When the thickness of the fluororesin layer is at least the above lower limit value, the release property will be more excellent. When the thickness of the fluororesin layer is at most the above upper limit value, the entire flexibility will be more excellent.

(Adhesive Layer)

The adhesive layer may, for example, be a layer formed from an adhesive.

The adhesive may, for example, be an adhesive agent known as an adhesive for dry lamination. The adhesive may be a polyvinyl acetate type adhesive, a polyacrylate adhesive made of a homopolymer or copolymer of an acrylic acid ester (ethyl acrylate, butyl acrylate, 2-ethylhexyl acrylate ester, etc.), or a copolymer of an acrylic acid ester and another monomer (methyl methacrylate, acrylonitrile, styrene, etc.), a cyanoacrylate type adhesive, an ethylene copolymer type adhesive made of a copolymer of ethylene and another monomer (vinyl acetate, ethyl acrylate, acrylic acid, methacrylic acid, etc.), a cellulose type adhesive, a polyester type adhesive, a polyamide type adhesive, a polyimide type adhesive, an amino resin type adhesive made of a urea resin or melamine resin, a phenol resin type adhesive, an epoxy type adhesive, a polyurethane type adhesive made of a combination of a polyol (a polyether polyol, a polyester polyol, etc.) and a polyisocyanate, or a reaction product thereof (such as an isocyanate group-containing polyurethane prepolymer), a reactive (meth)acryl type adhesive, a rubber type adhesive made of chloroprene rubber, nitrile rubber, styrene-butadiene rubber, etc., a silicone type adhesive, an inorganic type adhesive made of alkali metal silicate, low-melting point glass, etc.

The thickness of the adhesive layer may, for example, be from 0.1 to 5 g/m², as dried coating amount of the adhesive.

(Characteristics of Laminated Film)

The thermal shrinkage (180° C.) in MD of the present laminated film is preferably at least 2%, more preferably from 2 to 15%, particularly preferably from 2 to 10%.

The thermal shrinkage (180° C.) in TD of the present laminated film is preferably at least 2%, more preferably from 2 to 15%, particularly preferably from 2 to 10%.

When the thermal shrinkage (180° C.) in each of MD and TD of the present laminated film is at least the above lower limit value, it is possible to more effectively suppress formation of wrinkles at the time of raising the cavity bottom surface with which the laminated film is brought in close contact. When the thermal shrinkage (180° C.) in each of MD and TD is at most the above upper limit value, the mold followability will be good.

The thermal shrinkage (180° C.) in each of MD and TD of the present laminated film can be adjusted by the thermal shrinkage (180° C.) in each of MD and TD of the shrinkable film, the constituting ratio in thickness of the fluororesin layer and the layer of shrinkable film, etc.

The storage elastic modulus (180° C.) of the present laminated film is preferably at least 70 MPa, more preferably from 100 to 350 MPa, particularly preferably from 200 to 350 MPa. When the storage elastic modulus (180° C.) of the present laminated film is at least the above lower limit value, it is possible to more effectively suppress formation of wrinkles at the time of bringing the laminated film in contact with the cavity surface. When the storage elastic modulus (180° C.) is at most the above upper limit value, flexibility will be excellent, and mold followability will be good.

The storage elastic modulus (180° C.) of the present laminated film can be adjusted by the storage elastic modulus (180° C.) at 180° C. of each of the shrinkable film and the fluororesin layer, the constituting ratio in thickness of the fluororesin layer and the layer of shrinkable film, etc.

The thickness of the present laminated film is preferably from 25 to 100 µm, more preferably from 25 to 60 µm, particularly preferably from 25 to 50 µm. When the thickness of the present laminated film is at least the above lower limit value, it is possible to more effectively suppress formation of wrinkles at the time of bringing the present laminated film in close contact with the cavity surface. Further, it will be easy to handle the present laminated film. When the thickness of the present laminated film is at most the above upper limit value, the present laminated film will be easily deformable, and will be excellent in followability to the cavity surface of the mold.

(Method for Producing Laminated Film)

The present laminated film can be produced, for example, by the following method A or method B. However, the method for producing the present laminated film is not limited to these methods.

Method A: a method of forming a fluororesin layer by laminating a film of fluororesin on one side or both sides of a shrinkable film.

Method B: a method of forming a fluororesin layer by applying a coating liquid comprising a fluororesin and a liquid medium, on one side or both sides of a shrinkable film, and evaporating and removing the liquid medium to form a fluororesin layer.

As a method for producing the present laminated film, from the viewpoint of excellent economic efficiency, method A is preferred.

In method A, as a method for laminating each film, a known lamination method may be employed. Specifically, an extrusion lamination method, a dry lamination method, a heat lamination method, etc. may be mentioned. In the dry lamination method, each resin film is laminated by using an adhesive. Specific examples of the adhesive for dry lamination are as described above.

As the shrinkable film and the fluororesin film, commercially available ones may, respectively, be used, or ones produced by known production methods may be used. To these films, surface treatment such as corona treatment, plasma treatment, primer coating treatment or the like, may be applied.

The above-described present laminated film comprises a layer of shrinkable film, of which the storage elastic modulus (180° C.) is at least 70 MPa, and the thermal shrinkage (180° C.) in each of MD and TD is at least 3%, and a fluororesin layer present on one side or both sides of the layer of shrinkable film, whereby it is possible to suppress both of formation of wrinkles at the time of bringing the release film in close contact with the cavity surface in the compression molding, and formation of wrinkles at the time of raising the cavity bottom surface with which the release film is brought in close contact.

In the production of a semiconductor element, there is a case where a molded product (such as a resin sealing portion) is subjected to compression molding. First, while stretching by vacuum suction, a release film is brought in close contact with a recessed surface (cavity surface) of the lower mold. Then, a curable resin is disposed on the release film, and the lower mold and the upper mold are clamped, whereupon the cavity surface is raised, while heating these molds, so that the curable resin is cured by the heat.

When the lower mold is heated, the present laminated film is also heated. By this heat, the shrinkable film shrinks, and the fluororesin layer also shrinks by following the layer of shrinkable film, whereby the entire present laminated film shrinks. Since the thermal shrinkage (180° C.) of the shrinkable film is at least the above-mentioned lower limit value, the shrinkage amount of the present laminated film is large, whereby excess portions of the film will not be formed by raising of the cavity surface, and the curable resin can be cured in such a state that there are no wrinkles due to excess portions of the film. Further, since the storage elastic modulus (180° C.) of the shrinkable film is at least the above lower limit value, stiffness of the present laminated film is sufficiently strong, whereby the present laminated film is less likely to have wrinkles at the time of bringing the present laminated film in close contact with the cavity surface.

Accordingly, by using the present laminated film as a release film, it is possible to suppress both of formation of wrinkles at the time of bringing the release film in close contact with the cavity surface, and formation of wrinkles at the time of raising the cavity bottom surface with which the release film is brought in close contact. Since no wrinkles are present in the release film, it is possible to prevent an appearance defect due to transfer of the shape of wrinkles of the release film to the surface of the molded product.

Since it has the above effects, the present laminated film is useful as a release film. In particular, it is useful as a release film to be used in producing a semiconductor element by a compression molding method or a transfer molding method. Especially, it is particularly useful as a release film to be used in producing a semiconductor element by a compression molding method as described below, whereby poor appearance is likely to occur due to formation of wrinkles.

However, application of the present laminated film is not limited to a release film, and it may be used in other applications. Other applications may specifically be a food container, a medicine container, a medicine package member such as PTP, a shrink tape, a shrink functional tube covering material which is to be wound and shrunk on a tube, etc.

[Semiconductor Element]

A semiconductor element produced by the after-described method for producing a semiconductor element by using the present laminated film, comprises a substrate, a semiconductor chip, a connecting terminal and a resin sealing portion (package), and it may further contain other members as the case requires.

The resin sealing portion is composed of a cured product of a curable resin. The curable resin may simply be thermally curable, and an epoxy resin, a silicone resin, etc. may be mentioned. Among them, an epoxy resin is preferred. In the curable resin, carbon black, fused silica, crystalline silica, alumina, silicon nitride, aluminum nitride, etc. may be contained.

The semiconductor element may be an integrated circuit having a semiconductor element such as a transistor, diode or the like integrated, a light emitting diode having a light-emitting element, or the like.

The element shape of the integrated circuit may be one that covers the entire integrated circuit, or may be one that covers a portion of the integrated circuit (i.e. exposing a portion of the integrated circuit). The element shape may, for example, be BGA (Ball Grid Array), QFN (Quad Flat Non-leaded package), or SON (Small Outline Non-leaded package).

As the semiconductor element, from the viewpoint of productivity, one produced through collective sealing and singulation is preferred, and, for example, an integrated circuit wherein the sealing system is a MAP (Molded Array Packaging) system, or a WL (Wafer Lebel packaging) system, may be mentioned.

Figure 3:
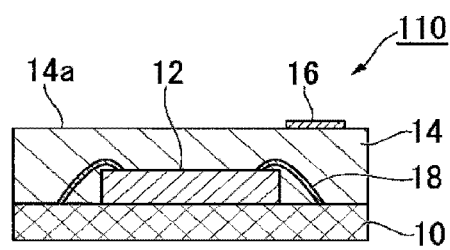
FIG. 3 is a schematic cross-sectional view showing an example of a semiconductor element to be produced by the method for producing a semiconductor element of the present invention.

FIG. 3 is a schematic cross-sectional view showing an example of a semiconductor element.

The semiconductor element 110 of this example comprises a substrate 10, a semiconductor chip 12 mounted on the substrate 10, a resin sealing portion 14 for sealing the semiconductor chip 12, and an ink layer 16 formed on the upper surface 14a of the resin sealing portion 14.

The semiconductor chip 12 has a surface electrode (not shown). The substrate 10 has a substrate electrode (not shown) corresponding to the surface electrode of the semiconductor chip 12. The surface electrode and the substrate electrode are electrically connected by a bonding wire 18 (connecting terminal).

The thickness of the resin sealing portion of the semiconductor element is preferably from 0.1 to 0.7 mm, particularly preferably from 0.1 to 0.5 mm.

The thickness of the resin sealing portion is the maximum thickness of the resin sealing portion in the thickness direction of the substrate. For example, in the case of the semiconductor element 110, the shortest distance from the semiconductor chip 12 mounting surface of the substrate 10 to the upper surface 14a of the resin sealing portion 14 is the thickness of the resin sealing portion 14.

In a compression molding method, for example, a release film is brought in close contact with the surface (cavity surface) of a recess provided in the lower mold; a curable resin is disposed thereon, and the lower mold and the upper mold are clamped, whereupon the bottom surface of the recess is raised. The depth of the recess of the lower mold at the time of bringing the release film in close contact therewith is, for example, about several times the thickness of the resin sealing portion. When the bottom surface of the recess is raised, in corresponding therewith, the stretched release film will shrink. In a conventional release film, if the thickness of the resin sealing portion to be formed is thin, i.e. if the amount to be stretched of the release film is small, the release film will not sufficiently shrink, whereby excess portions of the film are likely to be formed, thus leading to wrinkles. The present laminated film is, even when the thickness of the resin sealing portion is thin at a level of at most 0.7 mm, less likely to form wrinkles at the time of raising the bottom surface of the recess. Therefore, the present laminated film is particularly useful in a case where the thickness of the resin sealing portion is thin.

On the other hand, when the thickness of the resin sealing portion is at least 0.1 mm, the resin filling performance is good.

[Method for Producing Semiconductor Element]

The method for producing a semiconductor element of the present invention is a method wherein a semiconductor element comprising a substrate, a semiconductor chip, a connecting terminal and a resin sealing portion composed of a cured product of a curable resin, is produced by using a compression molding apparatus provided with an upper mold and a lower mold.

In the method for producing a semiconductor element of the present invention, a structure having a substrate, a semiconductor chip and a connecting terminal is disposed on one of the upper mold and the lower mold, the present laminated film as a release film is disposed to cover the recess formed on the other of the upper mold and the lower mold, so that the fluororesin layer surface faces the molding space of the mold, and is brought in close contact with the surface of the recess, a curable resin is disposed between the upper mold and the lower mold; the upper mold and the upper mold are clamped; the bottom surface of the recess is moved, to compress the curable resin; and at the same time, the curable resin is thermally cured to form a resin sealing portion.

There is no particular limitation to the compression molding apparatus to be used in the method for producing a semiconductor element of the present invention. Production conditions may also be made to be the same conditions as conditions in a known method for producing a semiconductor element, except that the present laminated film is used as the release film.

Figure 4:
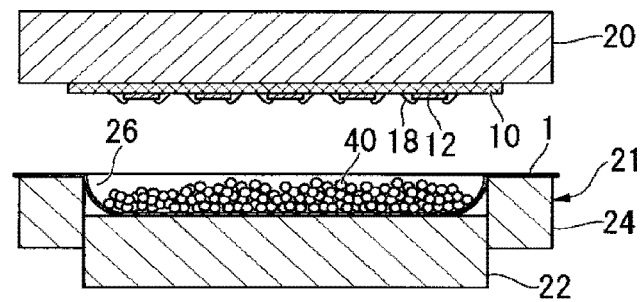
FIG. 4 is a cross-sectional view schematically illustrating steps 1 to 3 in one embodiment of the method for producing a semiconductor element of the present invention.
Figure 5:
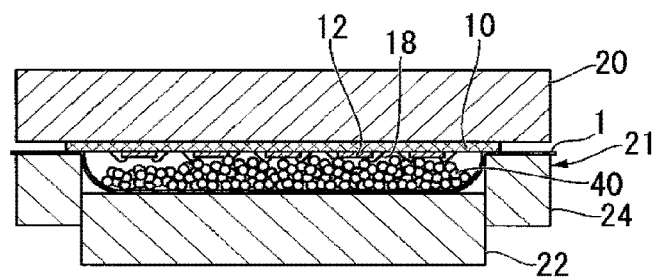
FIG. 5 is a cross-sectional view schematically illustrating step 4 in one embodiment of the method for producing a semiconductor element of the present invention.
Figure 6:
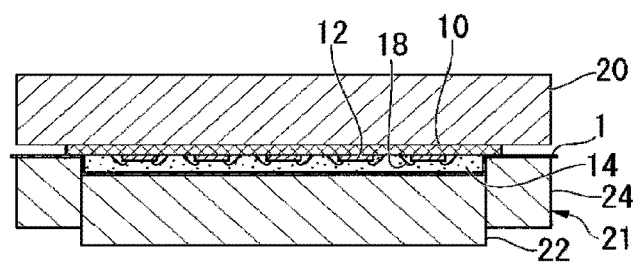
FIG. 6 is a cross-sectional view schematically illustrating step 5 in one embodiment of the method for producing a semiconductor element of the present invention.

Hereinafter, with reference to FIGS. 4 to 6, an embodiment of the method for producing a semiconductor element of the present invention will be described. FIGS. 4 to 6 show an example in which a compression molding is carried out by placing the structure having a substrate, a semiconductor chip and a connecting terminal on an upper mold, and placing the present laminated film so as to cover the recess provided in the lower mold.

This embodiment is an example in which a semiconductor element 110 shown in FIG. 3 is produced by using a compression molding apparatus having a cavity bottom surface member 22 and a frame member 24 as the lower mold, and using a laminated film 1 shown in FIG. 1 as a release film.

In the later-described Examples, compression molding was conducted by disposing a structure having a substrate, a semiconductor chip and a connecting terminal on the lower mold, and disposing the present laminated film so as to cover the recess provided in the upper mold. Also in the compression molding method in Examples, the production of a semiconductor element can be conducted in the same manner as the compression molding method as shown in FIGS. 4 to 6.

Compression Molding Apparatus:

The compression molding apparatus in this embodiment comprises an upper mold 20 and a lower mold 21, as shown in FIG. 4. The lower mold 21 comprises a cavity bottom surface member 22 and a frame member 24 disposed on the periphery of the cavity bottom surface member 22.

In the upper mold 20, a vacuum vent (not shown) is formed for adsorbing the substrate 10 to the upper mold 20 by sucking air between the substrate 10 and the upper mold 20.

In the cavity bottom surface member 22, a vacuum vent (not shown) is formed for adsorbing the release film to the cavity bottom surface member 22 by sucking air between the release film (laminated film 1) and the cavity bottom surface member 22.

The cavity bottom surface member 22 is disposed so that its upper surface (cavity bottom surface) is located below the upper edge of the inner peripheral surface of the frame member 24. Thus, the recess 26 is formed, so that the upper surface of the cavity bottom member 22 is the bottom surface, and the inner peripheral surface of the frame member 24 is the side surface. The cavity bottom surface member 22 is made movable in the vertical direction relatively to the frame member 24. By making the cavity bottom surface member 22 to be movable in the vertical direction relatively to the frame member 24, it is possible to change the depth of the recess 26.

The cavity surface in this embodiment is a general term for the surface of the recess 26, i.e. the upper surface of the cavity bottom surface member 22 and the inner circumferential surface of the frame member 24, forming the recess 26.

The method for producing a semiconductor element of this embodiment comprises the following steps 1 to 8.

Step 1: a step of disposing a structure comprising a substrate 10, a plurality of semiconductor chips 12 disposed on the substrate, and a bonding wire 18 (connecting terminal) for connecting each semiconductor chip 12 and the substrate 10, at a predetermined position of the upper mold 20 (FIG. 4).

Step 2: a step of disposing the laminated film 1 as a release film on the lower mold 21, so that the laminated film 1 covers the recess 26 of the lower mold 21, and vacuum suctioning the laminated film 1 to the bottom surface side of the recess 26, to bring it in close contact with the surface of the recess 26 (FIG. 4).

Step 3: a step of disposing a curable resin 40 in the recess 26 whose surface is covered with the laminated film 1 (FIG. 4).

Step 4: a step of clamping the molds by raising the cavity bottom surface member 22 and the frame member 24, in such a state that the curable resin 40 is disposed on the laminated film 1 in the recess 26, to form a molding space between the upper mold 20 and the lower mold 21 (FIG. 5).

Step 5: a step of raising only the cavity bottom surface member 22, and at the same time, heating the upper mold 20 and the lower mold 21, to melt and thermally cure the curable resin 40 to form a resin sealing portion 14 (FIG. 6). By this step, it is possible to obtain a collectively encapsulated structure having said structure and a resin sealing portion 14 having the plurality of semiconductor chips 12 of the structure collectively encapsulated.

Step 6: a step of opening the upper mold 20 and the lower mold 21 and taking out the collectively encapsulated structure.

Step 7: A step of cutting the substrate 10 and the resin sealing portion 14 of the collectively encapsulated structure so that the plurality of semiconductor chips 12 are separated. By this step, a singulated encapsulated structure having a substrate 10, at least one semiconductor chip 12, a bonding wire 18 and a resin sealing portion 14, is obtainable.

Step 8: a step of forming an ink layer 16 on the top surface 14a of the resin sealing portion 14 of the singulated encapsulated structure, by using an ink, to obtain a semiconductor element 110.

In step 2, the depth of the recess 6 at the time of bringing the laminated film 1 in close contact with the surface of the recess 26, is set depending on the thickness of the resin sealing portion 14, and is preferably from (the thickness of the resin sealing portion 14+0.025 mm) to (the thickness of the resin sealing portion 14+0.4 mm), more preferably from (the thickness of the resin sealing portion 14+0.05 mm) to (the thickness of the resin sealing portion 14+0.2 mm). In a case where the thickness of the resin sealing portion 14 is from 0.1 to 0.7 mm, the depth of the recess 6 is preferably from 0.125 to 1.1 mm. In a case where the thickness of the resin sealing portion 14 is from 0.1 to 0.5 mm, the depth of the recess 6 is preferably from 0.125 to 0.9 mm.

The heating temperature in step 5 is typically from 100 to 185° C., more typically from 150 to 180° C.

The thickness of the resin sealing portion 14 formed in step 5, is the same as the height (depth of the recess) from the upper surface of the cavity bottom surface member 22 after raising the cavity bottom surface member 22 to the upper edge of the inner peripheral surface of the frame member 24.

In the foregoing, the method for producing a semiconductor element of the present invention has been described with reference to an embodiment, but the present invention is not limited to the above embodiment. The respective constructions in the above embodiment and combinations thereof are merely exemplary, and within a range not departing from the concept of the present invention, additions, omissions, substitutions and other changes of the constructions are possible.

In the first embodiment, an example has been shown in which steps 7 and 8 are carried out in this order after step 6, but steps 7 and 8 may be carried out in the reverse order. That is, on the surface of the resin sealing portion of the collectively encapsulated structure, an ink layer may be formed by using an ink, and then, the substrate 10 and the resin sealing portion 14 of the collectively encapsulated structure may be cut.

As between step 1 and step 2, either step may be carried out first.

The distances between the collectively encapsulated plurality of semiconductor chips 12 one another may be uniform or non-uniform. The distances between the plurality of semiconductor chips 12 one another are preferably uniform, from such a viewpoint that sealing can be made uniform and the load exerted to each of the plurality of semiconductor chips 12 becomes uniform (the load becomes minimum).

The release film for use in the method for producing a semiconductor element of the present invention may be a present laminated film, and is not limited to the laminated film 1. For example, a laminated film 2 may be used as the release film.

In a case where, as the present laminated film, a laminated film having a fluororesin layer laminated on one side of a substrate, like the laminated film 2, is to be used, the laminated film is disposed on the lower mold so that the side of the layer 3 of shrinkable film faces the lower mold side. Thus, the fluororesin layer 5 which functions as a release layer will be in contact with the curable resin 40.

The upper mold and the lower mold to be used in the method for producing a semiconductor element of the present invention are not limited to the construction as shown in FIGS. 4 to 6.

The curable resin to be used in the method for producing a semiconductor element of the present invention is not limited to a solid one, and may be a liquid curable resin.

The semiconductor element to be produced by the method for producing a semiconductor element of the present invention is not limited to the semiconductor element 110. Depending on a semiconductor element to be produced, steps 7 and 8 in the above embodiment may not carried out.

For example, the shape of the resin sealing portion is not limited to one shown in FIG. 3, and there may be a step or the like. The semiconductor element to be encapsulated in the resin sealing portion may be one or more. The ink layer is not essential. In a case where a light-emitting diode is to be produced as a semiconductor element, the resin sealing portion will function also as a lens unit, and therefore, usually, an ink layer will not be formed on the surface of the resin sealing portion. In the case of a lens unit, the shape of the resin sealing portion may be selected from various lens shapes such as substantially hemispherical, shell-type, Fresnel lens type, semi-cylindrical, substantially hemispherical lens array type, etc.

EXAMPLES

In the following, the present invention will be described in detail with reference to Examples. However, the present invention is not limited by the following description.

Ex. 1 to 6 are Examples of the present invention, and Ex. 7 to 15 are Comparative Examples.

The measurement or evaluation methods and materials used in the respective Ex, are as follows.
(Evaluation Methods)
<Thickness>

The thickness of a film was measured by a contact type thickness meter OG-525H (manufactured by Ono Sokki Co., Ltd.), using feeler AA-026 (φ10 mm SR7).
<Storage Elastic Modulus (180° C.)>

A film was cut out in a length of 5 mm and a width of 5 mm to prepare a sample. As the sample, two types were prepared, i.e. Sample 1 in which MD of the film is in the length direction, and sample 2 in which TD of the film is in the length direction.

Using a dynamic viscoelasticity measuring apparatus DVA-200 (manufactured by IT Keisoku Instruments), the storage elastic modulus E' was measured. By setting the length between chucks to be 20 mm and the frequency to be 10 Hz, and raising the temperature at a rate of 2° C./min from 20° C., E' measured at a value of 180° C. was taken as the storage elastic modulus (180° C.).

The average value of the storage elastic modulus (180° C.) measured for sample 1 (storage elastic modulus in MD) and the storage elastic modulus (180° C.) measured for sample 2 (storage elastic modulus in TD), was adopted as the storage elastic modulus (180° C.) of the film.
<Thermal Shrinkage (180° C.)>

At 20° C., on a laminated film of 12 cm×12 cm, a linear line with a length of 10 cm was drawn one by one along the respective directions of MD and TD, whereby the endpoint-to-endpoint distance of each linear line was taken as an initial length $L_0$. Then, the laminated film was heat-treated under conditions of 180° C. for 30 minutes and cooled to 20° C., whereupon the linear distance $L_1$ between the end points of the linear line drawn on the laminated film was measured, and the dimensional change rate ΔL (%) was obtained by the following formula 1, whereby −(ΔL) was adopted as the thermal shrinkage (180° C.). From ΔL obtained for the linear line along MD, the thermal shrinkage in MD was obtained, and from ΔL obtained for the linear line along TD, the thermal shrinkage in TD was obtained.

Dimensional change rate $\Delta L(\%) = (L_1/L_0 - 1) \times 100$　　　Formula 1

<Production of Resin Sealing Product by Compression Molding Method>

Using a laminated film (or a single layered film) in each Ex. as a release film, a resin sealing product was produced in the following procedure.

Using an automatic molding apparatus MSL-06M manufactured by APIC YAMADA CORPORATION, a semiconductor sealing compression molding mold designed to carry out compression molding at a cavity depth of 0.65 mm with respect to a chip substrate with a width of 70 mm and a length of 230 mm, was prepared. The apparatus has a film unwinding and winding mechanism capable of continuously mounting a release film with a width of 140 mm. Further, this apparatus is a hybrid type device which is useful not only for compression molding but also for transfer molding, and therefore, it has a structure vertically opposite to a common compression molding apparatus as described by FIGS. 4 to 6. In the present invention, in performing the evaluation of releasability of a film, even when this apparatus was used, there was no change in the behavior as the compression molding apparatus shown in FIGS. 4 to 6.

In all of Examples, a film roll with a length of at least 20 m was prepared, and it was mounted on the apparatus, whereby a series of evaluations were carried out. Here, the film unwinding and winding operation was conducted so that the film was fed and wound up at a rate of 20 cm per second, and every time when a semiconductor chip was encapsulated, a new film was fed into the upper mold. The film feeding tension and resting tension at that time were both 8N. At first in the series of operations, the film was subjected to the unwinding and winding operation, whereby a state where a new part unwound from the film raw fabric roll was inserted between the molds was regarded as the molding starting point.

After one second from the molding starting point, while sucking air from an air discharge outlet provided in the upper mold, the film position was brought relatively close to the mold surface so as to be in contact with the upper mold, and finally adsorbed on the upper mold (state A).

Then, a structure having a semiconductor chip mounted on a copper plate with a thickness of 200 μm, was disposed on a lower mold, and thereon, a powdered epoxy material (manufactured by Sumitomo Bakelite Co., Ltd., EME-G600) was sprayed in a predetermined amount. Thereafter, the upper mold and the lower mold were clamped under 200 kN, and then, the inner upper surface of the upper mold was lowered to subject the lower compression Chase to compression molding at 30 kN on a flat plane. After maintaining the compressed state for 150 seconds, the molds were opened, and a resin sealing product was taken out (state B).
<Presence or Absence of Formation of Wrinkles at the Time of Close Contact with Cavity Surface>

In the state A, in the state where the molds were opened, the adsorbed state of the film was observed from below, and the presence or absence of formation of wrinkles in the release film at the time of being in close contact with the cavity surface was evaluated.
<Presence or Absence of Formation of Wrinkles at the Time of Raising the Cavity Bottom Surface>

In the state B, the shape of the film transferred to the surface of the obtained resin sealing product was observed, and the presence or absence of formation of wrinkles in the release film at the time of raising the cavity bottom surface, i.e. at the time of raising of the cavity bottom surface (at the time of EMC sealing), was evaluated.
<Appearance of Resin Sealing Product>

The appearance of the resin sealing product was visually observed, and whether or not unfilled portions causing wrinkles of the release film had been formed, was evaluated. A case where the unfilled portions had not been formed, was evaluated to be "good", and a case where the unfilled portions had been formed, was evaluated to be "bad".
(Materials Used)
<Fluororesin Films>
　ETFE-1: ETFE film with a thickness of 12 μm.
　ETFE-2: ETFE film with a thickness of 20 μm.
　ETFE-3: ETFE film with a thickness of 50 μm.
　These ETFE films were, respectively, produced by melt-extruding ETFE obtained in the following Production Example 1, by an extruder provided with a T-die having its lip opening adjusted so that the thickness of the film would be 12 μm, 20 μm or 50 μm, at 320° C., by adjusting the original roll, the film-forming rate and the nip pressure.

Production Example 1

Production of ETFE-1

A polymerization vessel having an internal volume of 1.3 L and equipped with a stirrer, was degassed; 881.99 g of 1-hydrotridecafluorohexane, 335.5 g of 1,3-dichloro-1,1,2,2,3-pentafluoropropane (trade name: AK225cb, manufactured by Asahi Glass Co., Ltd.) (hereinafter referred to as "AK225cb") and 7.0 g of PFBE, were charged; 165.2 g of TFE and 9.8 g of ethylene (hereinafter referred to as "E") were injected; inside of the polymerization vessel was heated to 66° C.; and 7.7 mL of an AK225cb solution containing 1 mass % of the tertiary butyl peroxypivalate (hereinafter referred to as "PBPV") as a polymerization initiator solution, was charged, to initiate the polymerization.

During the polymerization, a monomer mixture gas in a molar ratio of TFE/E=54/46 was continuously charged so that the pressure became to be constant. Further, in accordance with the charging of the monomer mixture gas, PFBE was charged continuously in an amount corresponding to 1.4 mol % to the total moles of TFE and E. After 2.9 hours from the initiation of the polymerization, at the time when 100 g of the monomer mixture gas had been charged, the inside temperature of the polymerization vessel was lowered to room temperature, and at the same time, the pressure of the polymerization vessel was purged to atmospheric pressure. Thereafter, the obtained slurry was suction-filtered through a glass filter, whereupon the solid content was recovered and dried at 150° C. for 15 hours, to obtain 105 g of ETFE-1. The obtained ETFE was a copolymer of TFE units/E units/PFBE units=52.5/46.3/1.2 (molar ratio), and MFR was 12 g/10 min.

<Substrate (Shrinkable Films and Comparative Products)>

Polyamide-1: biaxially stretched nylon film, manufactured by Unitika Ltd., trade name: Emblem MS (BC), thickness: 15 μm.

Polyamide-2: biaxially stretched nylon film, manufactured by Unitika Ltd., trade name: Emblem NK (BC), thickness: 15 μm.

Polyamide-3: biaxially stretched nylon film, manufactured by Unitika Ltd., trade name: Emblem ON (BC), thickness: 15 μm.

Polyamide-4: unstretched nylon film, manufactured by Mitsubishi Chemical Corporation, trade name: DIAMIRON (registered trademark) C-Z, thickness: 20 μm.

Polyamide-5: biaxially stretched nylon film, manufactured by Toyobo Co., Ltd., trade name: HARDEN (registered trademark) N1100, thickness: 12 μm.

Polyester-1: biaxially stretched PET film, manufactured by TEIJIN LIMITED, trade name: Tetoron (registered trademark) G2, thickness: 12 μm.

Polyester-2: biaxially stretched PET film, manufactured by TEIJIN LIMITED, trade name: Tetoron NS, thickness: 12 μm.

Polyester-3: biaxially stretched PET film, manufactured by Mitsubishi Chemical Corporation, trade name: Diafoil (registered trademark) H500, thickness: 25 μm.

Polyester-4: biaxially stretched PET film, manufactured by Teijin DuPont Films Ltd., trade name: TEFLEX (registered trademark) FT3PE, thickness: 25 μm.

Polyolefin: biaxially stretched polypropylene film, manufactured by Mitsui Chemicals Tohcello Inc., trade name: OP U-1 #20, thickness: 20 μm.

<Adhesive>

As an adhesive for dry lamination to bond the respective films, the following urethane type adhesive A was used. The main agent and the curing agent were mixed so that the mass ratio in solid contents (main agent:curing agent) would be 10:1, and ethyl acetate was used as a diluent.

"Urethane Type Adhesive A"

Main agent: CRISVON (registered trademark) NT-258 (manufactured by DIC Corporation).

Curing agent: Coronate 2096 (manufactured by Nippon Polyurethane Industry Co., Ltd.).

Ex. 1

Three films of the following A1, A2 and A3 were dry-laminated in the following procedure, to obtain a laminated film having A1, A2 and A3 laminated in this order.

A1: ETFE-1.
A2: polyamide-1.
A3: ETFE-1.

Procedure for dry lamination: On the first surface of A2, urethane type adhesive A was applied in an amount of 0.7 g/m$^2$ by using a gravure roll 2, and dried at 60° C. On this applied surface, A1 was overlaid and roll-pressed under conditions of 60° C. and 1 m/min, to obtain a laminate of A2 and A1. On the A2-side surface of this laminate (second surface of A2), urethane type adhesive A was applied in an amount of 0.7 g/m$^2$ and dried at 60° C. On this applied surface, A3 was overlaid and roll-pressed under conditions of 60° C. and 1 m/min. Then, aging was conducted at 40° C. for 96 hours to obtain a laminated film. The applied amount of the urethane type adhesive A was a dry coating amount.

Ex. 2 to 6, and Ex. 8 to 15

A laminated film was obtained in the same manner as Ex. 1, except that the type of the film to be dry-laminated, was changed as shown in Tables 1 and 2.

Ex. 7

ETFE-3 was used as it was, as a film in Ex. 7.

In Tables 1 to 2, the entire thickness of the laminated film or a single layered film (hereinafter referred to also as the "product film") in each Ex., and the storage elastic modulus (180° C.) and the thermal shrinkage (180° C.), as well as the evaluation results, of the product film and the substrate used, are shown.

TABLE 1

|  | Ex. 1 | Ex. 2 | Ex. 3 | Ex. 4 | Ex. 5 | Ex. 6 | Ex. 7 |
|---|---|---|---|---|---|---|---|
| Film | Laminated | Laminated | Laminated | Laminated | Laminated | Laminated | Single layered |
| A1 | ETFE-1 | ETFE-1 | ETFE-2 | ETFE-1 | ETFE-1 | ETFE-2 | ETFE-3 |
| A2 | Polyamide 1 | Polyamide 2 | Polyamide 1 | Polyamide 1 | Polyamide 2 | Polyamide 1 | Nil |

TABLE 1-continued

|  |  |  | Ex. 1 | Ex. 2 | Ex. 3 | Ex. 4 | Ex. 5 | Ex. 6 | Ex. 7 |
|---|---|---|---|---|---|---|---|---|---|
|  | A3 |  | ETFE-1 | ETFE-1 | ETFE-1 | Nil | Nil | Nil | Nil |
|  | Entire thickness (μm) |  | 40 | 40 | 56 | 28 | 28 | 28 | 50 |
| Substrate | Thermal shrinkage | MD | 10.2 | 20.1 | 10.2 | 10.2 | 20.1 | 10.2 | — |
| (A2) | (180° C.) (%) | TD | 4.7 | 24.1 | 4.7 | 4.7 | 24.1 | 4.7 | — |
|  | Storage elastic modulus (180° C.) (MPa) | MD/TD average | 329 | 345 | 329 | 329 | 345 | 329 | — |
| Product film | Thermal shrinkage (180° C.) (%) | MD | 8.8 | 8.9 | 6.5 | 9.5 | 14.5 | 8.4 | 0.2 |
|  |  | TD | 2.7 | 11.2 | 2.0 | 3.7 | 17.7 | 3.3 | 2.1 |
|  | Storage elastic modulus (180° C.) (MPa) | MD/TD average | 173 | 173 | 114 | 184 | 184 | 184 | 44 |
| Formation of wrinkles at the time of close contact with cavity surface |  |  | Absent | Absent | Absent | Absent | Absent | Absent | Present |
| Formation of wrinkles at the time of raising cavity bottom surface |  |  | Absent | Absent | Absent | Absent | Absent | Absent | Present |
| Appearance of resin sealing product |  |  | Good | Good | Good | Good | Good | Good | Bad |

TABLE 2

|  |  |  | Ex. 8 | Ex. 9 | Ex. 10 | Ex. 11 | Ex. 12 | Ex. 13 | Ex. 14 | Ex. 15 |
|---|---|---|---|---|---|---|---|---|---|---|
|  | Film |  | Laminated | Laminated | Laminated | Laminated | Laminated | Laminated | Laminated | Laminated |
|  | A1 |  | ETFE-1 | ETFE-1 | ETFE-1 | ETFE-1 | ETFE-1 | ETFE-1 | ETFE-1 | ETFE-1 |
|  | A2 |  | Polyester 1 | Polyamide 3 | Polyester 2 | Polyester 3 | Polyester 4 | Polyamide 4 | Polyamide 5 | Polyolefin |
|  | A3 |  | ETFE-1 | ETFE-1 | ETFE-1 | ETFE-1 | ETFE-1 | ETFE-1 | ETFE-1 | ETFE-1 |
|  | Entire thickness (μm) |  | 37 | 40 | 37 | 50 | 50 | 45 | 37 | 45 |
| Substrate (A2) | Thermal shrinkage (180° C.) (%) | MD | 2.6 | 3.9 | 2.6 | 2.3 | 3.6 | 3.0 | 1.5 | 23.4 |
|  |  | TD | 1.3 | 0.9 | 1.5 | 1.1 | 0.9 | 0.8 | 1.5 | 13.4 |
|  | Storage elastic modulus (180° C.) (MPa) | MD/TD average | 500 | 317 | 500 | 500 | 70 | 280 | 600 | 1 |
| Product film | Thermal shrinkage (180° C.) (%) | MD | 1.7 | 3.2 | 1.3 | 1.0 | 1.6 | 1.2 | 0.5 | 5.1 |
|  |  | TD | 0.3 | 0.9 | 0.2 | 0.5 | 0.4 | 0.3 | 0.6 | 2.3 |
|  | Storage elastic modulus (180° C.) (MPa) | MD/TD average | 148 | 142 | 145 | 206 | 189 | 157 | 150 | 24 |
| Formation of wrinkles at the time of close contact with cavity surface |  |  | Present | Present | Present | Present | Present | Present | Present | Absent |
| Formation of wrinkles at the time of raising cavity bottom surface |  |  | Absent *1 | Absent *1 | Absent *1 | Absent *1 | Absent *1 | Absent *1 | Absent *1 | Present |
| Appearance of resin sealing product |  |  | Bad | Bad | Bad | Bad | Bad | Bad | Bad | Bad |

*1: Wrinkles formed at the time of close contact with cavity surface were maintained as they were.

As described above, by using the laminated film in each of Ex. 1 to 6 as a release film, both at the time of close contact with the cavity surface and at the time of raising the cavity bottom surface, it was possible to suppress formation of wrinkles. Therefore, it was possible to obtain a resin sealing product excellent in appearance.

In contrast, the film in Ex. 7 did not contain a shrinkable film, whereby both at the time of close contact with the cavity surface and at the time of raising the cavity bottom surface, wrinkles occurred.

In the laminated films in Ex. 8 to 14, the thermal shrinkage (180° C.) in either one of MD and TD of the shrinkable film was less than 3%, whereby wrinkles occurred at the time of close contact with the cavity surface.

In the laminated film in Ex. 15, the storage elastic modulus (180° C.) of the shrinkable film was less than 70 MPa, whereby wrinkles occurred at the time of raising the cavity bottom surface. No formation of wrinkles at the time of close contact with the cavity surface was observed.

This application is a continuation of PCT Application No. PCT/JP2018/042015, filed on Nov. 13, 2018, which is based upon and claims the benefit of priority from Japanese Patent Application No. 2017-222227 filed on Nov. 17, 2017. The contents of those applications are incorporated herein by reference in their entireties.

REFERENCE SYMBOLS

1: laminated film, 2: laminated film, 3: layer of shrinkable film, 5: fluororesin layer, 10: substrate, 12: semiconductor chip, 14: resin sealing portion, 14a: upper surface of resin sealing portion 14, 16: ink layer, 18: bonding wire (connecting terminal), 20: upper mold, 21: lower mold, 22: cavity bottom surface member, 24: frame member, 26: recess, 40: curable resin, 110: semiconductor element

What is claimed is:
1. A laminated film, comprising:
   a layer of shrinkable film, of which the storage elastic modulus E' at 180° C. is at least 70 MPa, and the thermal shrinkage in 30 minutes at 180° C., with reference to 20° C., in each of the machine direction (MD) and the transverse direction (TD), is at least 3%, and a fluororesin layer present on one side or both sides of the layer of shrinkable film,
wherein at least one side of the laminated film is a surface of the fluororesin layer.

2. The laminated film according to claim 1, wherein the storage elastic modulus E' at 180° C. of the laminated film is at least 70 MPa, and the thermal shrinkage in 30 minutes at 180° C., with reference to 20° C. in each of MD and TD of the laminated film is at least 2%.

3. The laminated film according to claim 1, wherein the fluororesin layer is present on both sides of the layer of shrinkable film.

4. The laminated film according to claim 1, wherein an adhesive layer is further present between the layer of shrinkable film and the fluororesin layer.

5. The laminated film according to claim 1, wherein the shrinkable film is a biaxially stretched film.

6. The laminated film according to claim 1, wherein the shrinkable film is a shrinkable film composed of at least one type of resin selected from the group consisting of a polyamide resin, a polyester resin, a polystyrene resin, and a biological resin.

7. The laminated film according to claim 1, wherein the shrinkable film is a biaxially stretched polyamide resin film.

8. The laminated film according to claim 1, wherein the fluororesin layer comprises a fluororesin made of a fluoroolefin polymer.

9. The laminated film according to claim 8, wherein the fluoroolefin polymer is an ethylene-tetrafluoroethylene copolymer.

10. The laminated film according to claim 1, wherein the fluororesin layer is a layer of a fluororesin film.

11. The laminated film according to claim 1, which is used as a release film.

12. The laminated film according to claim 11, wherein the release film is a release film which is to be disposed in a recess of a mold so as to be in contact with a sealing resin, in a step of resin sealing in the production of a semiconductor element.

13. A method for producing a semiconductor element comprising a substrate, a semiconductor chip, a connecting terminal and a resin sealing portion made of a cured product of a curable resin, by using a compression molding apparatus comprising an upper mold and a lower mold, the method comprising:

disposing a structure having the substrate, the semiconductor chip and the connecting terminal on one of the upper mold and the lower mold,
disposing the laminated film according to claim 1, as a release film, so as to cover a recess provided in the other of the upper mold and the lower mold, and so that the surface of the fluororesin layer faces the molding space of the mold, and bringing it in close contact with the surface of the recess,
disposing a curable resin between the upper mold and the lower mold, and clamping the upper mold and the lower mold and moving the bottom surface of the recess thereby to compress the curable resin and at the same time to thermoset the curable resin to form a resin sealing portion.

14. The method for producing a semiconductor element according to claim 13, wherein the thickness of the resin sealing portion is from 0.1 to 0.7 mm.

15. The method for producing a semiconductor element according to claim 13, wherein the depth of the recess at the time of bringing the said laminated film in close contact with the surface of the recess is deeper than the thickness of the resin sealing portion, and is from 0.125 to 1.1 mm.

16. The laminated film according to claim 1, wherein the shrinkable film is a biaxially stretched film, and wherein the laminated film is produced by (A) laminating a film of fluororesin on one or both sides of the biaxially stretched film, or (B) applying a coating liquid comprising a fluororesin and a liquid medium on one side or both sides of the biaxially stretched film, and evaporating and removing the liquid medium to form the fluororesin layer.

17. The laminated film according to claim 1, wherein the fluororesin layer is made of a fluoroolefin polymer comprising ethylene units, tetrafluoroethylene units, and units of a third monomer.

18. The laminated film according to claim 17, wherein the third monomer is at least one selected from the group consisting of (a1) a fluoroolefin having 3 or less carbon atoms other than tetrafluoroethylene, (a2) a polyfluoroalkylethylene represented by $X^1(CF_2)_nCX^2{=}CH_2$ (wherein $X^1$ and $X^2$ are each independently a hydrogen atom or a fluorine atom, and n is an integer of from 2 to 8), (a3) a fluorovinyl ether, (a4) a functional group—containing fluorovinyl ether, (a5) a fluorinated monomer having an aliphatic ring structure, (b1) an olefin other than ethylene, (b2) a vinyl ester, (b3) a vinyl ether, and (b4) an unsaturated acid anhydride.

* * * * *